(12) United States Patent
Seo et al.

(10) Patent No.: US 9,130,090 B2
(45) Date of Patent: Sep. 8, 2015

(54) OLEFIN COMPOSITION

(75) Inventors: Beom Doo Seo, Daejeon (KR); Hoon Chae, Daejeon (KR); Choong Hoon Lee, Daejeon (KR); Jong Joo Ha, Daejeon (KR); Sung Ho Choi, Seoul (KR)

(73) Assignee: LG CHEM, LTD., Seoul (KR)

( * ) Notice: Subject to any disclaimer, the term of this patent is extended or adjusted under 35 U.S.C. 154(b) by 205 days.

(21) Appl. No.: 13/285,610

(22) Filed: Oct. 31, 2011

(65) Prior Publication Data

US 2012/0139132 A1 Jun. 7, 2012

(30) Foreign Application Priority Data

| Oct. 29, 2010 | (KR) | 10-2010-0106963 |
| Oct. 29, 2010 | (KR) | 10-2010-0106964 |
| Oct. 29, 2010 | (KR) | 10-2010-0106965 |
| Oct. 29, 2010 | (KR) | 10-2010-0106966 |
| Oct. 29, 2010 | (KR) | 10-2010-0106968 |
| Oct. 29, 2010 | (KR) | 10-2010-0106972 |
| May 25, 2011 | (KR) | 10-2011-0049379 |

(51) Int. Cl.
- *C08L 101/10* (2006.01)
- *C08L 51/06* (2006.01)
- *C08L 23/06* (2006.01)
- *H01L 31/048* (2014.01)

(52) U.S. Cl.
CPC ............. *H01L 31/0481* (2013.01); *C08L 23/06* (2013.01); *Y02E 10/50* (2013.01)

(58) Field of Classification Search
CPC ... C08L 23/06; C08L 2312/00; C08L 101/10; C08L 51/06
See application file for complete search history.

(56) References Cited

U.S. PATENT DOCUMENTS

| 5,350,812 A | 9/1994 | Sultan et al. | |
| 2004/0105994 A1* | 6/2004 | Lu et al. | 428/515 |
| 2006/0142490 A1* | 6/2006 | Oi | 525/192 |
| 2006/0201544 A1* | 9/2006 | Inoue | 136/251 |
| 2011/0174356 A1* | 7/2011 | Watanabe et al. | 136/244 |
| 2012/0214916 A1* | 8/2012 | Dube et al. | 524/156 |

FOREIGN PATENT DOCUMENTS

| EP | 0541747 B1 | 8/1999 | |
| JP | 06-049365 A | 2/1994 | |
| JP | 2008-509246 A | 3/2008 | |
| JP | 2010-212381 A | 9/2010 | |
| WO | WO 2010038875 A1 * | 4/2010 | Y02E 10/52 |

OTHER PUBLICATIONS

Adachi et al. Ind. Eng. Chem. Rev. 2008, 47, 1812-1819.*
Adachi et al. Macromol. React Eng. 2007, 1, 313-320.*
Machine Translation of JP 2010-212381.*

(Continued)

*Primary Examiner* — Mark Kaucher
(74) *Attorney, Agent, or Firm* — Mckenna Long & Aldridge LLP

(57) ABSTRACT

Provided are an olefin composition, filler and an optoelectronic device. One illustrative olefin composition may be effectively used as a filling material for various optoelectronic devices.

7 Claims, 3 Drawing Sheets

(56) References Cited

OTHER PUBLICATIONS

Adachi et al. "Controllable Silane Water-Cross-Linking Kinetics and Curability of Ethylene-Propylene Copolymer by Amine Compounds." American Chemical Society. 2008, vol. 47, p. 1812-1819.

K. Adachi & T. Hirano, "Controllable Silane Water-Cross-Linking and Curability of Ethylene-Propylene Copolymer by Amine Compounds", Ind. Eng. Chem. Res. 2008, 47, pp. 1812-1819, Feb. 14, 2008.

* cited by examiner

OLEFIN COMPOSITION

This application claims the benefit of Korean Patent Application Nos. 10-2010-0106963, filed Oct. 29, 2010, 10-2010-0106964, filed Oct. 29, 2010, 10-2010-0106965, filed Oct. 29, 2010, 10-2010-0106966, filed Oct. 29, 2010, 10-2010-0106968, filed Oct. 29, 2010, 10-2010-0106972, filed Oct. 29, 2010, and 10-2011-0049379, filed May 25, 2011, which are all hereby incorporated by reference for all purposes in their entirety as if fully set forth herein.

BACKGROUND

1. Field of the Invention

The present invention relates to an olefin composition, filler and a photovoltaic cell module.

2. Discussion of Related Art

A filler may be used to encapsulate a light emitting or sensing part of an optoelectronic device such as a photovoltaic cell, a light emitting diode (LED) or organic light emitting diode (OLED).

As a material of the filler, ethylene-vinyl acetate (EVA) polymer generally used in a photovoltaic cell module may be exemplified. However, the EVA polymer has a low adhesive strength, and therefore a device including the EVA polymer as a filler does not have sufficient durability. In addition, the EVA polymer is thermally degraded by a thermal compression process, and a toxic gas such as a citric acid gas is generated. Such a toxic gas may deteriorate a working environment, and induce degradation in performance of the device.

SUMMARY OF THE INVENTION

The present invention is directed to providing an olefin composition, a filler and a photovoltaic cell module.

In one embodiment, an illustrative olefin composition may include an olefin polymer that has at least one hydrolyzable group or at least one hydrolyzed product of the hydrolyzable group and a basic hydrolysis catalyst.

In one embodiment, the olefin composition may be a composition for a filler or a composition for a filler of an optoelectronic element. The composition for the filler of the optoelectronic element may refer to a composition used as a filling material encapsulating an optoelectronic element such as a photovoltaic cell, LED or OLED. In another embodiment, the olefin composition may be a composition for a material for a lamination process or increasing temperature lamination process.

The olefin polymer in the composition includes at least one hydrolyzable group or at least one hydrolyzed product of the hydrolyzable group. The term "olefin polymer or olefin resin" as used herein may refer to a polymer that includes at least one olefin monomer as a polymerization unit. In addition, the polymer may include a homopolymer, which is a uniform polymer prepared by using the same kind of a monomer; and a copolymer prepared by a reaction of at least two different monomers or prepared of the same kind of a monomer but having chemically different segments or blocks. In addition, herein, the phrase "included a monomer as a polymerization unit" may refer to a state in which a monomer forms a main or side chain of a polymer by a polymerization reaction.

The hydrolyzed product of the hydrolyzable group may be a material hydrolyzed by an action of the basic hydrolysis catalyst in the composition. In this document, the hydrolyzed product of the hydrolyzable group may also be referred to as a "reactive functional group." If the composition is used in the filler, the hydrolyzable group and the reactive functional group may allow the filler to have excellent adhesion strength. For example, if the filler is in contact with a glass substrate, the hydrolyzable group or reactive functional group may form a physical bond such as a hydrogen bond with a functional group on a surface of the glass substrate, or form a chemical covalent bond via a condensation reaction, thereby improving adhesion strength to the filler. In this document, the olefin polymer including at least one hydrolyzable group or at least one hydrolyzed product thereof may be referred to as a "modified olefin polymer."

A kind of the hydrolyzable group is not particularly limited. As a hydrolyzable group, a hydrolyzable silyl group may be used. In this document, an olefin polymer that has at least one hydrolyzable silyl group as the hydrolyzable group may be referred to as a "silane-modified olefin polymer." The term "hydrolyzable silyl group" as used herein may refer to a silyl group having at least one hydrolyzable residue.

As an example of the hydrolyzable silyl group, a functional group represented by Formula 1 may be used.

$$-Si(X)_m Y_{(3-m)} \quad \text{[Formula 1]}$$

In Formula 1, X is a hydrolyzable residue bound to the silicon atom, Y is a non-hydrolyzable residue bound to the silicon atom, and m is a number from 1 to 3.

In the Formula 1, the mark "—" may mean that the silicon atom represented by the "Si" is directly bound to the olefin polymer or indirectly bound to the olefin polymer via an appropriate linker.

As the hydrolyzable residue (X), a halogen atom, an alkoxy group, an aryloxy group, an acyloxy group, an alkylthio group or an alkyleneoxythio group may exemplified.

As the halogen atom in Formula 1, fluorine (F), chlorine (Cl), bromine (Br) or iodine (I) may be exemplified, and chlorine (Cl) may be preferably exemplified.

As the alkoxy group in Formula 1, an alkoxy group having 1 to 20 carbon atoms, 1 to 12 carbon atoms, 1 to 8 carbon atoms or 1 to 4 carbon atoms may be exemplified. The alkoxy group may have a linear, branched or cyclic structure, and may be optionally substituted by at least one substituent.

Also, the term "aryl group" in the aryloxy group in Formula 1 may include an aralkyl group or arylalkyl group as well as an aryl group, and may refer to a monovalent residue derived from a compound including at least one benzene ring or a structure in which at least two benzene rings are connected or condensed, or a derivative thereof. The aryl group may be an aryl group that has 6 to 25 carbon atoms, 6 to 21 carbon atoms, 6 to 18 carbon atoms or 6 to 18 carbon atoms. As the aryl group, phenyl, dichlorophenyl, chlorophenyl, phenylethyl, phenylpropyl, benzyl, tolyl, xylyl or naphthyl group may be exemplified, and phenyl group may be preferably exemplified. The aryl group may also be optionally substituted by at least one substituent.

In addition, the acyloxy group in Formula 1 may be an acyloxy group having 1 to 20 carbon atoms, 1 to 16 carbon atoms, or 1 to 12 carbon atoms. The acyloxyl group may be optionally substituted by at least one substituent.

In addition, the alkylthio group in Formula 1 may be an alkylthio group having 1 to 20 carbon atoms, 1 to 16 carbon atoms, 1 to 12 carbon atoms, 1 to 8 carbon atoms or 1 to 4 carbon atoms. The alkyleneoxythio group may be an alkyleneoxythio group having 1 to 20 carbon atoms, 1 to 16 carbon atoms, 1 to 12 carbon atoms, 1 to 8 carbon atoms or 1 to 4 carbon atoms. The alkylthio or alkyleneoxythio group may also be optionally substituted by at least one substituent.

In this document, the substituent which may be optionally substituted to a certain functional group may be, but is not limited to, a hydroxyl, epoxy, alkyl, alkenyl, alkynyl, alkoxy, acyl, thiol, acryloyl, methacryloyl, aryl or isocyanate group.

In Formula 1, X is preferably alkoxy. In one embodiment, the alkoxy group may be an alkoxy group having 1 to 20 carbon atoms, 1 to 16 carbon atoms, 1 to 12 carbon atoms, 1 to 8 carbon atoms, or 1 to 4 carbon atoms. The alkoxy group may be a linear, branched or cyclic alkoxy group, and optionally substituted by at least one substituent. The alkoxy group may be, but is not limited to, a methoxy, ethoxy, propoxy, isopropoxy or butoxy group, and preferably a methoxy or ethoxy group.

The non-hydrolyzable residue of Formula 1 may be hydrogen, or an alkyl or aryl group.

In this document, the alkyl group may be a linear, branched or cyclic alkyl group having 1 to 20 carbon atoms, 1 to 16 carbon atoms, 1 to 12 carbon atoms, 1 to 8 carbon atoms or 1 to 4 carbon atoms. The alkyl group may be optionally substituted.

As the aryl group in the "Y," the aryl group described in the aryloxy group in the "X" may be exemplified.

In addition, m of Formula 1 is a number of 1 to 3, but in another embodiment, m may be 2 or 3, or 3.

The olefin polymer that includes at least one hydrolyzable silyl group may be prepared by, for example, copolymerizing at least one alpha-olefin and at least one unsaturated silane compound, or by, for example, grafting at least one unsaturated silane compound to an olefin resin.

In one embodiment, the olefin polymer may be a copolymer that includes at least one copolymerized alpha olefin and at least one copolymerized unsaturated silane compound of Formula 2; or a graft polymer that includes an olefin resin to which the unsaturated silane compound of Formula 2 is grafted.

$$DSi(X)_m Y_{(3-m)}$$ [Formula 2]

In Formula 2, D is an alkenyl group bound to the silicon atom, and X, Y and m are the same as defined in Formula 1.

The alkenyl group in Formula 2 may be a linear, branched or cyclic alkenyl group having 2 to 20 carbon atoms, 2 to 16 carbon atoms, 2 to 12 carbon atoms, 2 to 8 carbon atoms or 2 to 4 carbon atoms. The alkenyl group may be optionally substituted by at least one substituent. The alkenyl group may be a vinyl, allyl, prophenyl, isoprophenyl, butenyl, hexenyl, cyclohexenyl or octenyl group, and generally a vinyl group.

The unsaturated silane compound in Formula 2 may be, but is not limited to, vinyltrimethoxy silane, vinyltriethoxy silane, vinyltripropoxy silane, vinyltriisopropoxy silane, vinyltributoxy silane, vinyltripentoxy silane, vinyltriphenoxy silane or vinyltriacetoxy silane.

The alpha olefin included in the olefin polymer or olefin resin may be a linear, branched or cyclic substituted or unsubstituted alpha olefin having 2 to 20 carbon atoms, 2 to 16 carbon atoms, 2 to 12 carbon atoms, 2 to 8 carbon atoms or 2 to 4 carbon atoms. The alpha olefin may be, but is not limited to, ethylene, propylene, 1-butene, isobutylene, 1-pentene, 2-methyl-1-butene, 3-methyl-1-butene, 1-hexene, 1-heptane, 1-octene, 1-nonene or 1-decene, and preferably ethylene.

In case where the olefin polymer is the copolymer, the copolymer may include 0.1 to 10.0 parts by weight, or 0.5 to 5.0 parts by weight of the unsaturated silane compound relative to 100 parts by weight of the alpha olefin, and in case where the olefin polymer is the graft polymer, the graft polymer may include 0.1 to 10.0 parts by weight, or 0.5 to 5.0 parts by weight of the unsaturated silane compound relative to 100 parts by weight of the olefin resin. Herein, unless explicitly defined otherwise, the unit "part by weight" as used herein may refer to a weight ratio of respective components.

The silane-modified olefin polymer may be, but is not limited to, a graft polymer prepared by grafting the unsaturated silane compound of Formula 2 to the olefin resin.

In one embodiment, the olefin resin to which the unsaturated silane compound is grafted may be polyethylene. The term "polyethylene" may include a homopolymer prepared by polymerizing ethylene, and a copolymer having at least 50 mol % of copolymerized ethylene along with a different alpha-olefin or a different comonomer as a polymerization unit.

The polyethylene may be at least one of low-density polyethylene, medium-density polyethylene, high-density polyethylene, ultra low-density polyethylene, super ultralow-density polyethylene and linear low-density polyethylene.

As the polyethylene to which the unsaturated silane compound is grafted, polyethylene having many side chains may be used. In the polyethylene having lots of side chains, grafting may be more effectively performed. The polyethylene having lots of side chains generally has a low density, and the polyethylene having fewer side chains generally has a high density. Thus, the low-density polyethylene may be preferably used.

In one embodiment, the polyethylene may have a density of approximately 0.85 to 0.96 g/cm$^3$ or approximately 0.85 to 0.92 g/cm$^3$.

In addition, the polyethylene may have a melt flow rate (MFR) at 190° C. of approximately 0.1 to 50 g/10 min, approximately 1.0 to 50.0 g/10 min or approximately 1.0 to 30.0 g/10 min.

The polyethylene having the above-mentioned physical properties may be more effectively grafted than the unsaturated silane compound. When the composition includes the polyethylene having the above-mentioned physical properties, it may have excellent moldability and adhesion.

The composition includes a basic hydrolysis catalyst. The basic hydrolysis catalyst may convert the hydrolyzable group into the reactive functional group by hydrolyzing the hydrolyzable group of the olefin polymer during the preparation process of the filler or during the encapsulation process of an element with the composition or the filler.

The basic hydrolysis catalyst may suitably maintain a degree of the hydrolysis so as to effectively modulate physical properties of the composition or filler according to a purpose. In addition, the basic hydrolysis catalyst may stably maintain the entire physical properties as intended with no bad influence on different components included in the composition.

As the basic hydrolysis catalyst, at least one or two of an organic amine compound, a heterocyclic compound that includes at least one nitrogen as a ring-membered atom, a metal hydroxide and a metal amide may be exemplified. In the above, the organic amine compound may be alkyl amine or dialkyl amine. An alkyl group in the organic amine compound may be an alkyl group having 1 to 20 carbon atoms, 1 to 16 carbon atoms, 1 to 12 carbon atoms, 1 to 8 carbon atoms or 1 to 4 carbon atoms. The alkyl group may be a linear, branched or cyclic alkyl, and may be optionally substituted with at least one substituent or unsubstituted.

Specifically, the organic amine compound may be, but is not limited to, ethyl amine, hexyl amine, n-propyl amine, butyl amine, dodecyl amine or dibutyl amine.

In the above, the term "heterocyclic compound" may refer to a cyclic hydrocarbon compound including at least one nitrogen atom as the hetero atom forming a ring. As the heterocyclic compound, a cyclic hydrocarbon compound that includes one or two nitrogen atom as the hetero atom and also includes three to eight ring-membered atoms may be exemplified. In one embodiment, as the heterocyclic compound, pyridine may be exemplified.

In addition, as a metal hydroxide, NaOH, KOH, RbOH or CsOH may be used, and as a metal amide, $NaNH_2$, $KNH_2$, $RbNH_2$ or $CsNH_2$ may be used.

Among these catalysts, an organic amine compound, preferably alkyl amine or dialkyl amine, more preferably alkyl amine including an alkyl group of 1 to 16 carbon atoms or dialkyl amine including an alkyl group of 2 to 32 carbon atoms, may be used, but is not limited thereto.

The composition may include 0.01 to 5 parts by weight, 0.01 to 2 parts by weight, 0.05 to 1.5 parts by weight or 0.05 to 1.0 parts by weight of the basic hydrolysis catalyst relative to 100 parts by weight of the modified olefin polymer. In such a weight ratio, the physical properties of the composition may be effectively modulated.

The composition may further include at least one or two selected from a photostabilizer, a UV absorbent and a thermal stabilizer when necessary.

The photostabilizer may serve to capture a radical for deterioration by light of the olefin polymer to prevent photooxidation. As the photostabilizer, a hindered amine compound or hindered piperidine compound may be used, but the present invention is not limited thereto.

In addition, the UV absorbent may absorb UV rays incident to the composition, and convert the incident UV rays into harmless thermal energy in a molecule, thereby preventing excitement of a radical for initiating deterioration by light of the olefin polymer. The UV absorbent may be, but is not limited to, a benzophenone-based, benzotriazole-based, acrylnitril-based, metal complex salt-based, hindered amine-based, organic-based, such as ultra fine particle oxide titanium or ultra fine particle zinc oxide, or inorganic-based UV absorbent.

In addition, the thermal stabilizer may be, but is not limited to, a phosphorous-based thermal stabilizer such as tris(2,4-di-tert-butylphenyl)phosphate, bis[2,4-bis(1,1-dimethylethyl)-6-methylphenyl]ethylester phosphorous acid, tetrakis (2,4-di-tert-butylphenyl)[1,1-biphenyl]-4,4'-diiylbisphosphate and bis(2,4-di-tert-butylphenyl) pentaerythritoldiphosphate; or a lactone-based thermal stabilizer such as a reaction product of 8-hydroxy-5,7-di-tert-butyl-furan-2-one with o-xylene.

A content of the photostabilizer, UV absorbent and/or thermal stabilizer is not particularly limited. A content of the additive may be suitably selected in consideration of a use of the composition, a shape or density of the additive, etc., and may be conventionally modulated with in a suitable range of 0.01 to 5 parts by weight relative to 100 parts by weight of the total solid component of the composition.

The composition may further include various suitable additives known in the corresponding art according to a use, other than the above-mentioned components.

The present invention also relates to a filler. The exemplary filler may include at least one olefin polymer that includes at least one hydrolyzable group or at least one hydrolyzed product of the hydrolyzable group, i.e., at least one reactive functional group. For example, the filler may be used to encapsulate various optoelectronic elements.

The filler may have, for example, a sheet or film shape. A thickness of the filler may be modulated to approximately 10 to 2000 μm, and preferably approximately 100 to 1250 μm in consideration of support efficiency and damage possibility of the diode, weight lightening or workability of the device, etc. However, a film thickness of the filler may be changed according to an applied specific use.

In one embodiment, the filler may have a gel fraction in a range from 5% to 60%. The gel fraction may be measured according to the specification of ASTM D 2765 after keeping the filler in water of 90° C. for 18 hours.

In another embodiment, the filler may have the gel fraction in a range from 5 to 55%, from 10 to 50%, or from 20 to 50%. If the gel fraction of the filler is in the above range, the filler may have a suitable crosslinking structure. The gel fracture may be controlled by modulating a degree of introduction of a hydrolyzable group into the olefin polymer and/or a degree of hydrolysis of the hydrolyzable group.

In another embodiment, the filler may have 90-degree peel strength of 70 N/15 mm or more. The 90-degree peel strength may measured after compressing the filler on a glass substrate at 150° C. for 10 minutes by using a laminator such as a vacuum laminator.

The peel strength may be 100 N/15 mm or more, 120 N/15 mm or more, or 160 N/15 mm or more. The peel strength is a 90-degree peel strength measured after adhering the filler to a glass substrate by compression using a laminator, and specifically a peel strength measured according to a method described in the following example. The upper limit of the peel strength is not particularly limited, and for example, may be modulated to 300 N/15 mm or less.

For example, the peel strength may be controlled by modulating a ratio of the hydrolyzable group introduced into the olefin polymer or a degree of hydrolysis of the hydrolyzable group.

In another embodiment, the filler may have an index of the hydrolyzable group in the range from 0.01 to 1.5, and an index of a hydrolyzed product of the hydrolyzable group in the range from 0.01 to 1.5. The indices may be measured by using Fourier transform infrared spectrometry (FT-IR).

In the above, the index of the hydrolyzable group and the index of a hydrolyzed product of the hydrolyzable group are the indices capable of showing the degree of conversion of the hydrolyzable group in the olefin polymer including at least one hydrolyzble group, which is used for preparing the filler, into the hydrolyzed product, i.e., the reactive functional group, by being hydrolyzed during the preparation process of the filler. For example, in case where the index of the hydrolyzable group is relatively high and the index of the hydrolyzed product is relatively low, it may mean that a relatively small amount of the hydrolysis of the hydrolyzable group is occurred. Also, in case where the index of the hydrolyzable group is relatively low and the index of the hydrolyzed product is relatively high, it may mean that a relatively large amount of the hydrolysis of the hydrolyzable group is occurred. If the index of the hydrolyzable group and the index of a hydrolyzed product of the hydrolyzable group are controlled to be in the above range, it may be possible to maintain the physical properties of the filler including the adhesion strength.

In the above, the index of the hydrolyzable group and the index of a hydrolyzed product of the hydrolyzable group, i.e., the reactive functional group, may be calculated according to the following Equations 1 and 2.

$$H=A/B \qquad \text{[Equation 1]}$$

$$R=C/B \qquad \text{[Equation 2]}$$

In Equations 1 and 2, H is the index of the hydrolyzable group, A is the intensity of the peak observed by the hydrolyzable group in the filler in FT-IR analysis, B is the intensity of the peak observed at 720 $cm^{-1}$ in the FT-IR analysis, R is the index of the reactive functional group, and C is the intensity of the peak observed by the reactive functional group in the filler in the FT-IR analysis.

The FT-IR analysis may be performed by a method described in the following example. In addition, numerical value "A" is a peak intensity of the hydrolyzable group observed in the FT-IR analysis according to a kind of the hydrolyzable group introduced into the olefin polymer, and a specific position may be determined according to a specific kind of the hydrolyzable group. Numerical value "C" is a peak intensity of the reactive functional group observed in the FT-IR analysis according to a kind of the reactive functional group generated by hydrolysis of the hydrolyzable group introduced into an olefin polymer, and a specific position of the peak may be determined according to a specific kind of the reactive functional group. In addition, a peak observed at 720 $cm^{-1}$ in the FT-IR analysis is a peak generated by rocking of the entire "—$CH_2$—" of the polymer, and an intensity C of the peak in Equations 1 and 2 is used as a reference value.

The filler may have the index of the hydrolyzable group (H of Equation 1) of 0.05 to 0.5, 0.05 to 0.3 or 0.1 to 0.2. The index of the reactive functional group (R of Equation 2) may be 0.03 to 0.5 or 0.03 to 0.1.

In one embodiment, the filler may be prepared using the olefin composition. Therefore, the filler may further include a basic hydrolysis catalyst. If the composition that includes the olefin polymer including the hydrolyzable group along with the basic hydrolysis catalyst is used, compared to the case where a olefin composition including a different kind of catalyst such as an organic metal catalyst is used, it may be more advantageous to realize the previously-described gel fraction, peel strength or an index of a hydrolyzable group or reactive functional group.

The filler may include the olefin composition in a state where the components as described above are uniformly mixed in the composition or in a state where at least some part of the components are physically or chemically reacted with each other in the composition. In one embodiment, the filler may be prepared by molding the composition in a film or sheet shape by a molding method such as thermal melting extrusion or T-die molding.

In one embodiment, in case where the filler is prepared by the olefin composition, the remaining amount of the basic hydrolysis catalyst in the prepared filler may be in the range from 1 ppm to 50,000 ppm, from 3 ppm to 10,000 ppm, from 10 ppm to 10,000 ppm, from 50 ppm to 7,000 ppm or from 300 ppm to 6,000 ppm. The remaining amount may be measured by HPLC (High Performance Liquid Chromatography).

Theoretically, the catalyst controls the hydrolysis reaction rate of the hydrolyzable group, and keeps its original state after the termination the reaction, and therefore the amount of the catalyst mixed in the olefin composition which is the raw material of the filler will stay the same after the filler is prepared. However, the catalyst mixed in the olefin composition can be actually disappeared during the preparation process of the filler, or the chemical structure or the properties of the catalyst can be actually changed during the controlling of the hydrolysis reaction rate. Therefore, the amount of the catalyst mixed in the olefin composition can be different from the remaining amount of the catalyst in the prepared filler. Therefore, if only the amount of the catalyst mixed in the olefin composition is considered, it can be difficult to design the filler having the predetermined physical properties.

However, if the remaining amount of the catalyst is controlled to be in the above range, it may become easier to realize an appropriate crosslinking structure in the filler, and therefore to effectively obtain the predetermined physical properties.

The present invention also relates to a method of preparing the filler. The illustrative method may include molding a composition including an olefin polymer including at least one hydrolyzable group in a film or sheet shape. The method may include molding the olefin composition including the basic hydrolysis catalyst in a film or sheet shape.

The method may include, for example, preparing the olefin composition and then molding the prepared olefin composition in a film or sheet shape.

The olefin composition may be prepared, for example, by mixing alpha-olefin and unsaturated silane compound, preparing an olefin polymer by simultaneously or gradually copolymerizing the components in the mixture in the presence of a radical polymerization initiator, and blending the polymer with a hydrolysis catalyst, for example, a basic hydrolysis catalyst. In the above, during mixing the alpha-olefin and the unsaturated silane compound, if necessary, different kinds of comonomer may be mixed together. In addition, in the copolymerzing step, if necessary, a suitable chain transfer agent may be used together. In addition, before or after the blending of the catalyst, or at the same time as the blending, different kinds of additive such as a photostabilizer, a UV absorbent or a thermal stabilizer may be blended together. In one embodiment, the polymerization of the olefin polymer and the blending of an additive such as a catalyst may be performed in the same reactor.

The olefin composition may also be prepared by preparing a modified olefin polymer by mixing an olefin resin and an unsaturated silane compound and then grafting the unsaturated silane compound to the olefin resin in the presence of a radical generator, and mixing the modified olefin polymer with an additive such as a basic hydrolysis catalyst.

In one embodiment, the olefin composition may be prepared by grafting the silane compound of Formula 2 to an olefin resin and then mixing the preapred polymer to which the silane compound is grafted and a basic hydrolysis catalyst. The grafting of the silane compound may be performed in the presence of a radical generator. In addition, the grafting and the mixing of the catalyst may be performed in the same reactor.

A kind of the reactor is not particularly limited. As the reactor, for example, an extruder or a cylinder including at least one hopper may be used. If such a reactor is used, for example, an olefin polymer may be prepared by inputting a liquid silane compound and a radical generator to an olefin polymer heated and melted by an extruder so as to perform an extrusion process, or mixing an olefin polymer, a radical generator and a silane compound in a hopper and then inputting the mixture to a cylinder, and reacting the mixture by heating and melting.

In the method, a hydrolysis catalyst may be input to a reactor in which an olefin polymer is prepared before or after the polymer is formed or at the same time that the polymer is formed. In addition, a hydrolysis catalyst may also be input together with a different additive such as a UV absorbent, a thermal stabilizer or a photostabilizer.

If the preparation of such a polymer and the mixture of the additive are done in a single reactor, the process may be simplified.

A hydrolysis catalyst and/or different additive may be directly input to a reactor, or may be input in a type of master batch to be mixed. The master batch is a raw material in a pellet type in which an additive is concentrated at a high concentration and dispersed.

A method of inputting an additive to a reactor in which an olefin polymer is formed is not particularly limited, and may be a method of equipping a side feeder in a suitable position of an extruder or cylinder and inputting a master batch-type additive through the provider, or a method of mixing an additive with the olefin polymer in a hopper.

In the method, a specific kind and design of a reactor, thermal melding, mixing or conditions including a temperature and time of a reaction or a kind of a radical generator and a method of preparing a master batch are not particularly limited, and may be suitably selected in consideration of ingredients to be used.

In addition, a method of molding the composition in a sheet or film shape is not particularly limited, and a conventional film- or sheet-making process such as a T-die process or extrusion may be used. In the method, the above-mentioned process of preparing a composition and the film- or sheet-forming process are preferably performed in situ using apparatuses connected with each other.

The present invention also relates to an optoelectronic device. An exemplary optoelectronic device may include an optoelectronic element encapsulated with the composition.

The encapsulated optoelectronic element may be a light emitting or sensing part of a photovoltaic cell, LED or OLED.

The olefin polymer in the composition encapsulating the diode may have a crosslinking structure suitably formed by a hydrolyzable group or reactive functional group, and thus maintain excellent adhesion to different part in the optoelectronic device.

In one embodiment, a remaining amount of the hydrolysis catalyst in the composition encapsulating the diode may be 1 to 50,000 ppm, and in this range, a suitable crosslinking structure may be realized. As described above, theoretically, the amount of the catalyst mixed in the olefin composition will stay the same after the preparation of the filler or the optoelectronic device. However, in actual process, the amount of the catalyst mixed in the olefin composition can become different from the remaining amount of the catalyst in the filler or in the optoelectronic device. Therefore, it may be difficult to design the optoelectronic device having the predetermined properties by considering simply only the amount of the catalyst mixed in the olefin composition; however, it may become easier to realize the appropriate crosslinking structure in the filler by controlling the remaining amount of the catalyst.

In another embodiment, the remaining amount of the catalyst may be 3 to 10,000 ppm, 10 to 10,000 ppm, 50 to 7,000 ppm or 300 to 6,000 ppm. The remaining amount of the catalyst is a numerical value measured by high-performance liquid chromatography (HPLC) after the encapsulation as will be described later.

A specific structure of the optoelectronic device or a method of encapsulating an optoelectronic element using the composition is not particularly limited, and a method and structure conventionally applied to the art according to a corresponding device may be used.

For example, when the optoelectronic device is a photovoltaic cell, the optoelectronic device, as shown in FIG. 1 or 2, may be a photovoltaic cell module including light-receiving substrates 11 and 21, back sheets 12 and 22, and photo-electromotive diodes 13 and 23 disposed between the light-receiving substrates 11 and 21 and the back sheets 12 and 22 and encapsulated with fillers 14 and 24. Here, the fillers 14 and 24 may include an olefin composition described above. FIG. 1 shows a conventional structure of a device 1 in which a silicon wafer-based active layer is used as a photo-electromotive diode 13, and FIG. 2 shows a conventional structure of a device 2 in which a thin film active layer formed by deposition is used as a photo-electromotive diode 23.

For example, the module may be prepared according to a desired structure by stacking the light-receiving substrates 11 and 21, the fillers 14 and 24, the photo-electromotive diodes 13 and 23 and the back sheets 12 and 22, vacuum absorbing the stacked result and thermally compressing the stacked result by a conventional molding method such as lamination. Conditions of the lamination are not particularly limited, and the lamination may be conventionally performed at 90° C. to 230° C. or 110° C. to 190° C. for 5 to 60 minutes or 8 to 40 minutes.

Specific kinds of the light-receiving substrates 11 and 21, the back sheets 12 and 22 and the photo-electromotive diodes 13 and 23 are not particularly limited. For example, as the light-receiving substrates 11 and 21, a glass plate, or a transparent composite sheet formed by stacking glass, a fluorine polymer sheet, an anti-weather film and a barrier film may be used, and as the back sheets 12 and 22, a composite sheet formed by stacking a metal such as aluminum, a fluorine polymer sheet, an anti-weather film and a barrier film may be used. In addition, as the photo-electromotive diodes 13 and 23, a silicon wafer-based active layer or a thin film active layer formed by deposition may be used.

BRIEF DESCRIPTION OF THE DRAWINGS

The above and other objects, features and advantages of the present invention will become more apparent to those of ordinary skill in the art by describing in detail exemplary embodiments thereof with reference to the adhered drawings, in which.

DETAILED DESCRIPTION OF EXEMPLARY EMBODIMENTS

Hereinafter, the present invention will be described in detail with reference to Examples according to the present invention and Comparative Examples not according to the present invention, but the scope of the present invention is not limited to the following examples.

In the specification, the following measurement method will be applied to measure physical properties.

1. FT-IR Analysis

Figure 1:
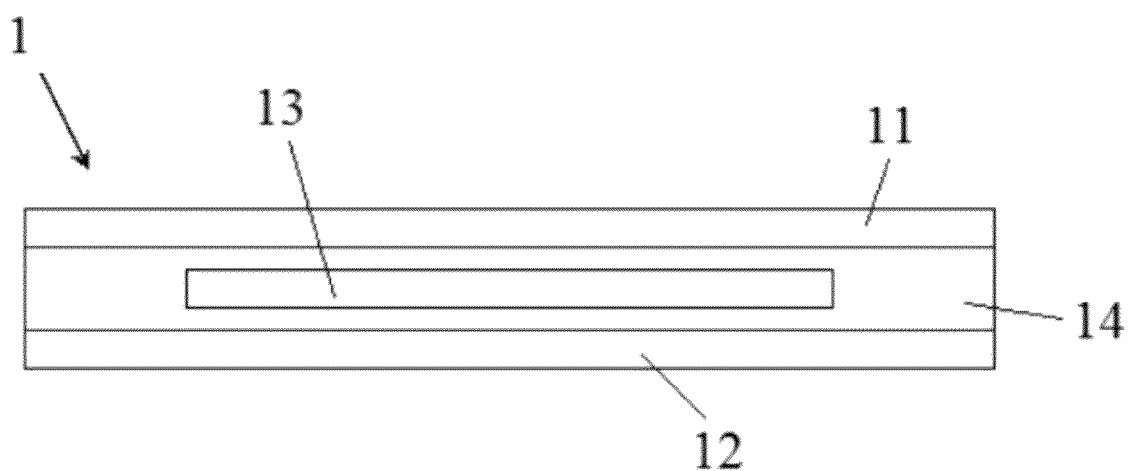
FIGS. 1 and 2 are schematic diagrams of photovoltaic cell modules according to one exemplary embodiment of the present invention.
Figure 2:
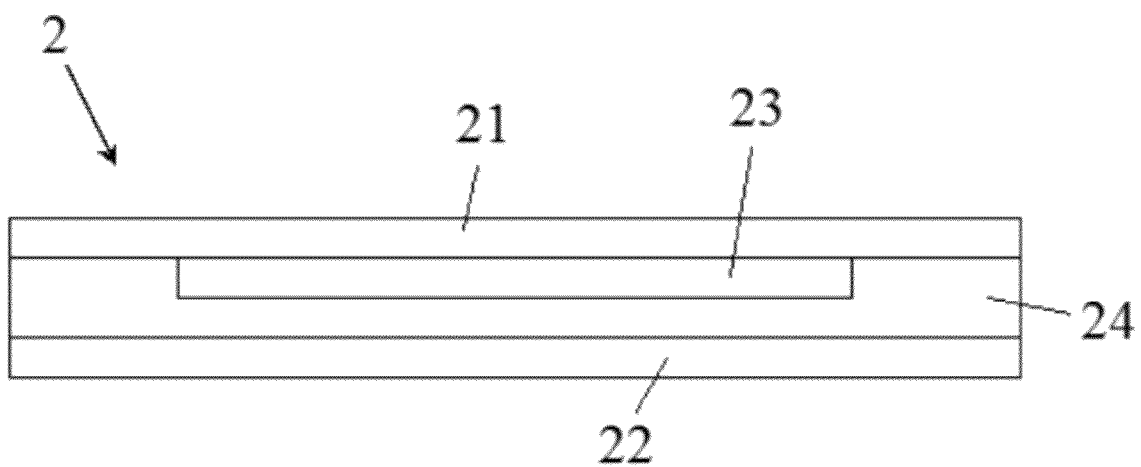
Figure 3:
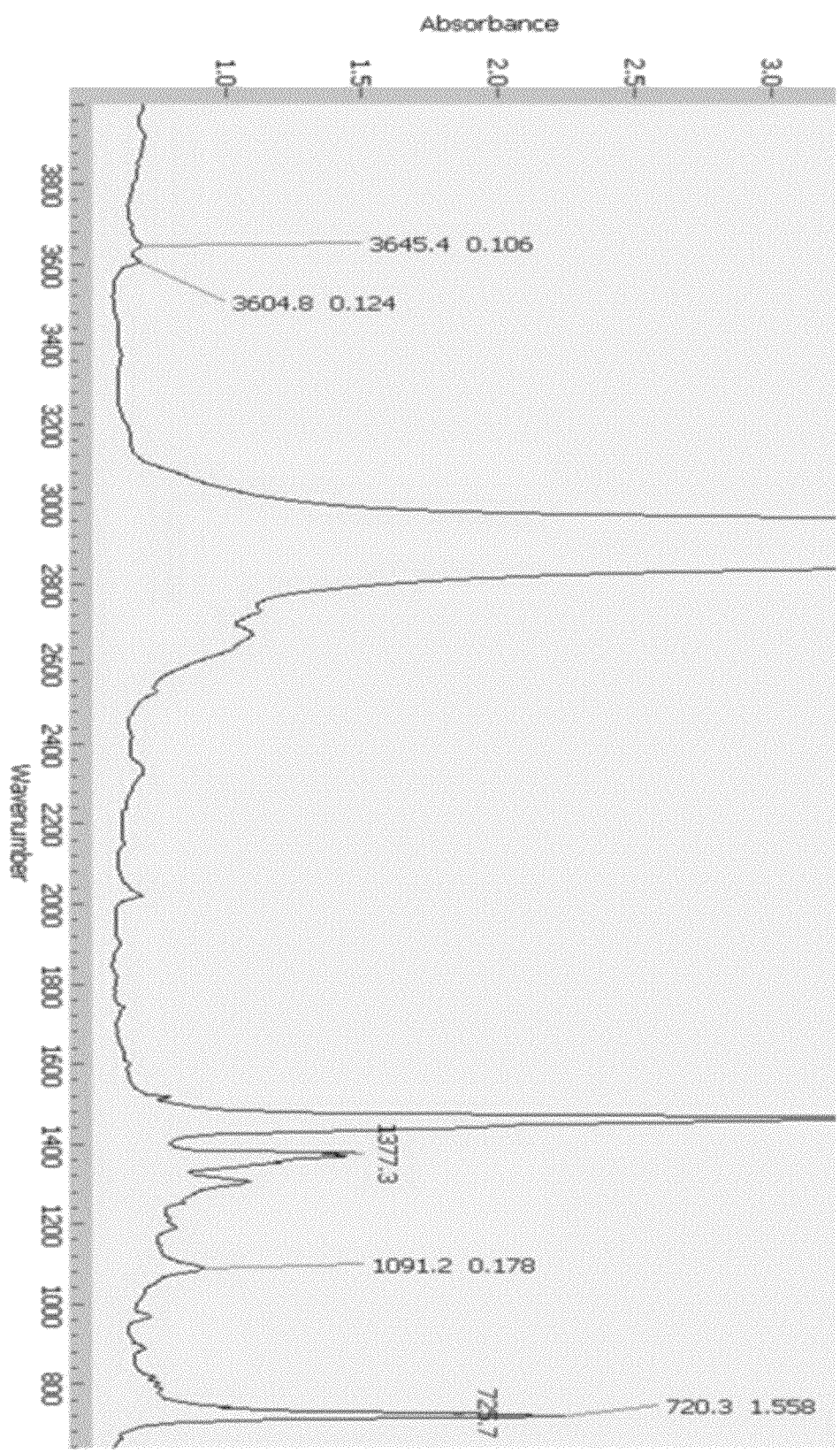
FIG. 3 is a spectrum of FT-IR analysis measured according to Example 1.

FT-IR analysis was performed with respect to fillers prepared in Example and Comparative Example using an FT-IR analyzer (FTS 3000, BIO-RAD). In the analyzed FT-IR spectrum, a peak caused by a stretching movement of a methoxy group of methoxysilyl (Si—OCH$_3$), which is a hydrolyzable group, introduced to an olefin polymer was observed at 1091 cm$^{-1}$, and a peak caused by a stretching movement of a hydroxyl group of a reactive functional group (Si—OH) produced by hydrolyzing the hydrolyzable group was observed at 3645 cm$^{-1}$. Accordingly, an intensity of the peak observed at 1091 cm$^{-1}$, an intensity of the peak observed at 720 cm$^{-1}$ and an intensity of the peak observed at 3645 cm$^{-1}$ were put to Equations 3 and 4 obtained from Equations 1 and 2, thereby calculating indices of the hydrolyzable group and the reactive functional group. FIG. 3 is an FT-IR analysis graph according to Example 1.

Index of Hydrolyzable Group=(Peak Intensity at 1091 cm$^{-1}$)/(Peak Intensity at 720 cm$^{-1}$)     [Equation 3]

Index of Reactive Functional Group=(Peak Intensity
at 3645 cm$^{-1}$)/(Peak Intensity at 720 cm$^{-1}$)    [Equation 4]

2. Measurement of Peel Strength

A filler was cut to a sample having a size of 15 mm (length)×200 mm (width). The sample was adhered to a glass plate by compressing the sample using a vacuum laminator (ICOLAM produced by Meier) at 150° C. for 10 minutes. Afterwards, the adhered filler was peeled off using a tension tester (LEPlus produced by Lloyd) at a peel rate of 50 mm/min and an angle of 90 degrees, thereby measuring a peel strength. The glass plate may be a glass plate commonly used as a light-receiving substrate of a photovoltaic cell module.

3. Measurement of Gel Fraction

A filler was cut to a sample having a size of 10 mm (length)×10 mm (width). Subsequently, the sample was kept in water of 90° C. for 18 hours. Then, the gel fraction of the filler was measured according to ASTM D-2765.

4. Analysis of Amount of Remaining Catalyst

The remaining amount of the catalyst in a filler after a photovoltaic cell module was manufactured was measured using an HPLC apparatus (Alliance 2690, Detector: PDL produced by Waters) according to a manual of the manufacturer.

EXAMPLE 1

Manufacture of Filler 98 parts by weight of polyethylene having a density of 0.880 g/cm$^3$ and MFR at 190° C. of 5 g/10 min, 2 parts by weight of vinyl trimethoxy silane and 0.1 parts by weight of dicumyl peroxide were mixed in an extruder, melted and stirred at 200° C., thereby grafting the vinyl trimethoxy silane to the polyethylene. In addition, 100 parts by weight of low-density linear polyethylene having a density of 0.870 g/cm$^3$, 4 parts by weight of a hindered amine photostabilizer, 2 parts by weight of a benzophenone UV absorber, 2 parts by weight of phosphorous thermal stabilizer and 1 part by weight of dodecyl amine ($C_{12}H_{25}NH_2$) were mixed, and melt-processed, thereby forming a master batch in a pellet. Then, 10 parts by weight of the master batch was input to the extruder using a side feeder, relative to 100 parts by weight of polyethylene to which the vinyl trimethoxy silane was grafted, and then mixed together, thereby preparing an olefin composition. Subsequently, the composition was input to a side hopper of a film molding device having a twin-screw extruder (ɸ 27 mm) and a T dice (width: 500 mm), and processed at an extrusion temperature of 200° C. and a take-out rate of 3 m/min, thereby obtaining a sheet-shaped filler having a thickness of approximately 500 µm.

Manufacture of Photovoltaic Cell Module

A glass plate having a thickness of approximately 3 mm, a prepared filler, a crystal silicon wafer photovoltaic element and a back sheet (a sheet formed by laminating a polyvinyl fluoride sheet (thickness: 38 µm), an aluminum thin film (thickness: 30 µm) and a polyvinyl fluoride sheet (thickness: 38 µm)) were sequentially laminated, and compressed using a vacuum laminator at 150° C. for 15 minutes, thereby manufacturing a photovoltaic cell module.

EXAMPLE 2

A filler and a module were manufactured by the same method as described in Example 1, except that 1 part by weight of butyl amine ($C_4H_9NH_2$) was used, instead of 1 part by weight of dodecyl amine ($C_{12}H_{25}NH_2$), in preparation of the master batch.

COMPARATIVE EXAMPLE 1

A filler and a photovoltaic cell module were manufactured by the same method as described in Example 1, except that 1 part by weight of dibutyl dilaurate (DBTDL) was used, instead of 1 part by weight of dodecyl amine ($C_{12}H_{25}NH_2$), in preparation of the master batch.

COMPARATIVE EXAMPLE 2

A filler and a photovoltaic cell module were manufactured by the same method as described in Example 1, except that dodecyl amine ($C_{12}H_{25}NH_2$) was not used in preparation of the master batch.

Analysis results for Examples and Comparative Examples are summarized in Table 1.

TABLE 1

| | FT-IR | | Peel Strength (N/15 mm) | Gel Fraction (wt %) |
|---|---|---|---|---|
| | Index of Reactive functional group | Index of Hydrolyzable Group | | |
| Example 1 | 0.08 | 0.12 | 210 | 44 |
| Example 2 | 0.05 | 0.16 | 180 | 27 |
| Comparative Example 1 | 0.12 | 0.06 | 20 | 81 |
| Comparative Example 2 | 0.00 | 0.20 | 50 | 2 |

Experimental Example: Examination of Physical Properties According to Amount of Remaining Catalyst For a filler (sample 1) of the photovoltaic cell module prepared in Example 1, a filler (sample 2) of the photovoltaic cell module prepared by the same method as described in Example 2 except that 10 parts by weight of butyl amine ($C_4H_9NH_2$) was used in the master batch, a filler (sample 3) of the photovoltaic cell module prepared by the same method as described in Comparative Example 1 except that 10 parts by weight of DBTLD was used in the master batch and a filler (sample 4) of the photovoltaic cell module prepared in Comparative Example 2 were used, amounts of remaining basic hydrolyzable catalysts were measured, and the results are shown in Table 2 with peel strengths and gel fractions.

TABLE 2

| | Amount of Remaining Basic Hydrolysis Catalyst (ppm) | Peel Strength (N/15 mm) |
|---|---|---|
| Sample 1 | 470 | 210 |
| Sample 2 | 5,000 | 200 |
| Sample 3 | — | 20 |
| Sample 4 | 0 | 50 |

From the results shown in Table 2, it was confirmed that physical properties including adhesion can be effectively realized and modulated by modulating an amount of the remaining basic hydrolyzable catalyst in the filler after modulation.

According to the present invention, an olefin composition which can be effectively used as a filling material can be provided.

What is claimed is:

1. A olefin composition for a filler, comprising:
an olefin polymer that has at least one hydrolyzable group or at least one hydrolyzed product of the hydrolyzable group; and a basic hydrolysis catalyst which is alkylamine, wherein the olefin polymer is a graft polymer that comprises polyethylene to which an unsaturated silane compound of Formula 2 is grafted, wherein the polyethylene has a density of 0.85 g/cm³ to 0.96 g/cm³, wherein the basic hydrolysis catalyst is comprised in an amount of 0.01 to 5 parts by weight relative to 100 parts by weight of the olefin polymer, $$DSi(X)_m Y_{(3-m)} \qquad \text{[Formula 2]}$$

wherein D is an alkenyl group bound to the silicon atom, X is a hydrolyzable residue bound to the silicon atom, Y is a non-hydrolyzable residue bound to the silicon atom, and m is a number of 1 to 3, and wherein the composition has a 90-degree peel strength at a peel rate of 50 mm/min that measured after being compressed on a glass substrate using a laminator at 150° C. for 10 minutes is not less than 160 N/15 mm.

2. The composition according to claim 1, wherein the graft polymer comprises 0.1 to 10.0 parts by weight of the unsaturated silane compound relative to 100 parts by weight of the polyethylene.

3. A filler that comprise an olefin polymer and a basic hydrolysis which is alkylamine, wherein the olefin polymer has at least one hydrolyzable group and at least one hydrolyzed product of the hydrolyzable group hydrolyzed in the presence of the basic hydrolysis catalyst, wherein the olefin polymer is a graft polymer that comprises polyethylene to which an unsaturated silane compound of Formula 2 is grafted, wherein the polyethylene has a density of 0.85 g/cm³ to 0.96 cm³, wherein the basic hydrolysis catalyst is comprised in an amount of 0.01 to 5 parts by weight relative to 100 parts by weight of the olefin polymer;

$$DSi(X)_m Y_{(3-m)} \qquad \text{[Formula 2]}$$

wherein D is an alkenyl group bound to the silicon atom, X is a hydrolyzable residue bound to the silicon atom, Y is a non-hydrolyzable residue bound to the silicon atom, and m is a number of 1 to 3, and wherein the composition has a 90-degree peel strength at a peel rate of 50 mm/min that measured after being compressed on a glass substrate using a laminator at 150° C. for 10 minutes is not less than 160 N/15 mm.

4. The filler according to claim 3, of which a gel fraction that is measured according to ASTM D 2765 after being kept in water of 90° C. for 18 hours is from 5% to 60%.

5. The filler according to claim 3, wherein the olefin polymer has an index of a hydrolyzable group in a range from 0.01 to 1.5, and an index of the hydrolyzed product of the hydrolyzable group in a range from 0.01 to 1.5, the indices being measured by Fourier transform infrared spectrometry.

6. An optoelectronic device that comprises an optoelectronic element that is encapsulated by the composition of claim 1.

7. The device according to claim 6, wherein an amount of the remaining hydrolysis catalyst in the composition encapsulating the optoelectronic element is from 1 ppm to 50,000 ppm.

* * * * *